Jan. 3, 1967 D. L. MOORE 3,296,501

METALLIC CERAMIC COMPOSITE CONTACTS
FOR SEMICONDUCTOR DEVICES
Filed Nov. 7, 1962

United States Patent Office 3,296,501
Patented Jan. 3, 1967

3,296,501

METALLIC CERAMIC COMPOSITE CONTACTS FOR SEMICONDUCTOR DEVICES

David L. Moore, Jeannette, Pa., assignor to Westinghouse Electric Corporation, Pittsburgh, Pa., a corporation of Pennsylvania Filed Nov. 7, 1962, Ser. No. 235,973
10 Claims. (Cl. 317—234)

The present invention relates to a metalized ceramic base contact member for a semiconductor device.

Heretofore in the prior art, problems have arisen in mounting semiconductor wafers upon conductive base members. The main criteria for selecting a base member have been based on high electrical and thermal conductivity. However, during the mounting of the semiconductor wafer, imperfections or failure may often occur in the wafer because of mechanical strains produced during the thermal cycling process involved in forming the solder bond to the conductive base. The metals usually employed for the base member, such as copper, aluminum, iron and base alloys thereof, have a thermal expansion about twice that of germanium and about four times that of silicon. Therefore, during the soldering operation strain is introduced into the wafer, usually during the cooling phase of the soldering cycle. The base contracts to a substantially greater extent than the semiconductor in cooling from the freezing or solidus temperature of the bonding solder material to room or operating temperature so that the wafer is placed under substantial compression at room temperature.

This problem has been partially alleviated by employing an intermediate member or mounting material usually referred to as a contact member between the wafer and the base member. The contact member for silicon was usually a nickel-cobalt-iron alloy selling under the trade name Kovar or tungsten and the contact member usually employed for germanium was molybdenum or tantalum. While the coefficient of expansion of the named contact members are closely similar to the same for the semiconductor wafers which they are associated with, the contact members frequently do not have the highest desired thermal conductivity necessary to ensure efficient operation in semiconductor devices. Thus the nickel-cobalt-iron alloy is a poor heat conductor. Furthermore, the use of such expensive metals as tungsten, tantalum, and molybdenum increases the cost of the semiconductor devices utilizing them.

The object of the present invention is to provide a semiconductor device comprising a semiconductor wafer and at least one metalized, apertured, thermally conductive ceramic contact member bonded to the wafer, the apertures containing an electrically conductive metal, the ceramic member having a thermal coefficient of expansion of about the same value as that of the wafer.

Other objects of the invention will, in part, be obvious and will, in part, appear hereinafter.

In order to more fully understand the nature and objects of the invention, reference should be had to the following detailed description and drawings, of which:

In accordance with the present invention and in attainment of the foregoing objects there is provided a semiconductor device comprising, in combination, a semiconductor wafer such as silicon or germanium, and one or more metalized, apertured, thermally conductive ceramic contact members bonded to the wafer, the apertures containing an electrically conductive metal. The ceramic member should have a thermal coefficient of expansion of substantially the same value as that of the semiconductor wafer over the temperature range to which the combination is subjected in manufacture and use. A particularly advantageous ceramic material for the base contact member for a silicon wafer is beryllium oxide. Beryllium oxide has a coefficient of expansion of 5.8 times $10^{-6}$ per degree centigrade in the range of 20° C. to 200° C. as compared with 4 times $10^{-6}$ per degree centigrade for silicon.

A particular advantageous material for the base contact member for a germanium wafer is aluminum oxide. The coefficient of expansion for aluminum oxide in the range of 20° C. to 200° C. is about 6.6 times $10^{-6}$ per degree centigrade while the same coefficient for germanium is about 6.2 times $10^{-6}$ per degree centigrade.

While the base contact material is a ceramic, such as beryllium oxide or aluminum oxide, is a relatively good thermal conductor and is a very good electrical insulator, it must be modified to provide readily solderable surfaces and to impart good conductivity for electrical current. One method of adaptation consists of metalizing the entire outer surface of a cylindrical wafer member of the ceramic material. Accordingly, the member is made solderable and an electrically conductive path is provided between the flat end surfaces of the member by the metalized portions on the sides. However, since current is conducted only around the edges of the contact member, it may cause an uneven current distribution in the device due to unsymmetrical variations in joining which will hamper its operation or reduce the power capabilities of the device. A preferred method of providing an electrically conductive path in larger power devices is to make a plurality of perforations in the ceramic disc and then metalizing the entire outer surface and the surfaces of the walls of the perforations or apertures. The apertures are then filled with a highly electrically conductive metal such as copper, silver, gold, nickel, aluminum, iron or base alloys thereof.

It should be understood that other ceramic materials such as, zirconium oxide, cordierite, silicon carbide or some steatites may be substituted for beryllium oxide and aluminum oxide as long as the expansion coefficient of the ceramic is closely similar to that of the semiconductor wafer to which it is joined. Also, the ceramic member employed should have a relatively good thermal conductivity.

Figure 1:
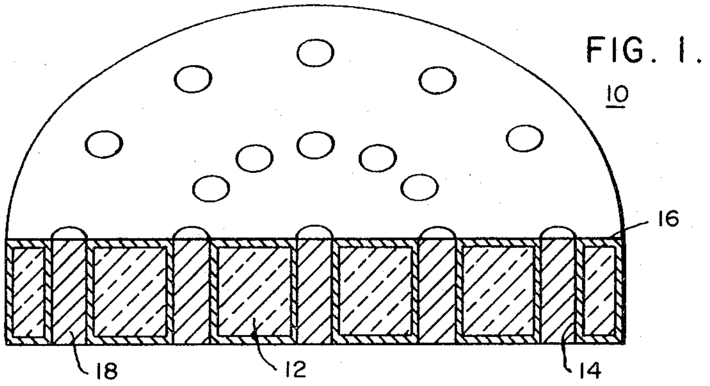
FIGURE 1 is a perspective view partly in cross section of a ceramic contact member for a semiconductor device.

Referring to FIG. 1, an apertured ceramic contact member 10 may be produced by compressing a quantity of powdered ceramic material 12 in a die and then sintering the resulting compact to provide a solid unitary body. The thickness of the ceramic member may vary between 10 mils and 150 mils depending upon the size of the device in which it is to be utilized, however, greater or lesser thicknesses can be produced. The member 10 is then punched or drilled to provide a plurality of apertures 14 therethrough. An alternative means method of providing apertures is to dispose the powder during the compacting operation in a die having aperture forming pins or projections, wherein the apertures are automatically provided in the pressing operation. The ceramic material 12 of member 10 may then be metalized with a layer 16 of an electrically conductive metal by any suitable conventional metalizing process such as plating, spraying, or fusing. Finally, an electrically conductive metal is disposed within the apertures and the member 10 is heated to the melting temperature (lower than the melting temperature of the metal in layer 16) of the conductive metal 18, so that the conductive metal fills the apertures flush with the upper and lower surfaces and wets the metalized layer 16. The member 10 is then cooled to room temperature.

Figure 2:
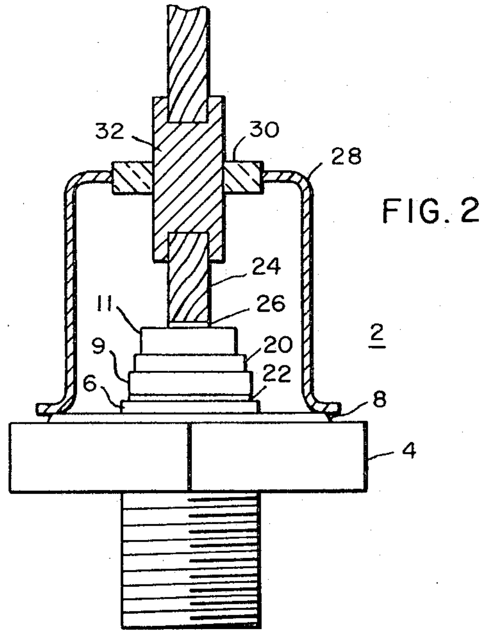
FIG. 2 is an elevation view partly in cross-section of a semiconductor device employing the base contact member of the invention.

With reference to FIG. 2, there is shown a semi-conductor device 2 comprising a support member 4 of copper, for example, having an elevated pedestal surface 6 circumscribed by a narrow ring projection 8. Two ceramic members 9 and 11 are joined to the lower and upper surfaces respectively, of a semiconductor wafer 20. Ceramic member 9 is joined to the elevated pedestal surface 6 of support 4 by means of a layer 22 of solder, such as a silver or gold base solder. The other ceramic member 11 is joined to a flexible electrical lead assembly 24 by means of a solder 26. A header 28 containing an apertured insulating ring 30 fused to a conductor 32 is welded to the support 4 at the narrow ring projection 8, the lead assembly 24 being joined to conductor 32, to hermetically enclose the semiconductor wafer 20.

The following example is illustrative of the teachings of the invention. A ceramic base contact member as is shown in FIGURE 1, is prepared by disposing a quantity of powdered beryllium oxide ceramic material in a die, compressing the powder at a pressure of about 5 tons per square inch, removing the compact from the die and sintering at a temperature of about 1800° C. The resulting compact may be about ½ inch in diameter and 20 mils thick. A plurality of some 12 apertures of 10 to 15 mils diameter are then made in the ceramic member by punching or drilling. A slurry of powdered molybdenum and manganese is then prepared and a thin coating of the same is applied by brushing to the outer surfaces of the member and the inner walls of the apertures and is subsequently fired to fuse it to the ceramic. The outer surfaces and inner walls of the apertures are then nickel plated in a conventional nickel electroplating bath. The apertures are filled with copper wire chips, heated to the melting temperature of copper and then solidified.

The base contact member may then be joined to a silicon semiconductor wafer by conventional means such as, by employing a solder therebetween so that it is joined to the base contact member in a single operation. The ceramic base contact member may be employed in a device such as that shown in FIGURE 2 or in any other semiconductor devices known to those skilled in the art.

For larger ceramic contact members, up to 50 or more apertures may be produced. The diameter of the apertures may vary some, being small and others larger. The apertures may be of several mils diameter at the lower end up to 20 to 25 mils at the upper end of a range of suitable sizes. Usually the apertures will be symmetrically or uniformly arranged.

Metalizing of the ceramic wafer by flame spraying or plasma jet spraying is suitable, though firing of a fusible coating has advantages for small apertures. Gas plating using a decomposable metal carbonyl such as nickel carbonyl, or electroless plating from a nickel or cobalt phosphites solution is also usable.

It should be understood that the ceramic wafer may have an irregular outer surface comprising numerous reentrant angles, or even a plurality of cuts or slits which extended surfaces may be metallized to provide increased electrical conductivity.

Figure 3:
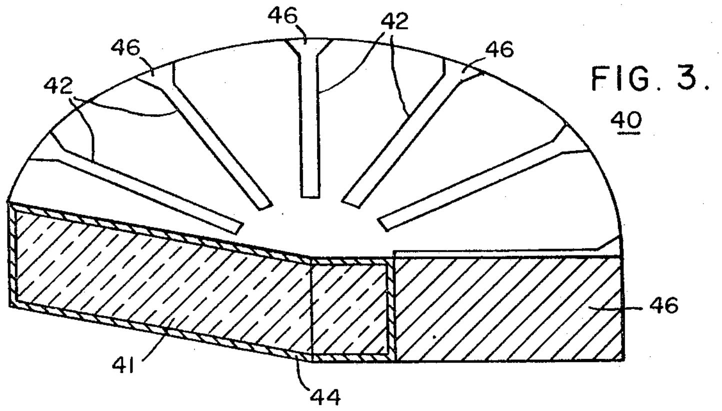
FIG. 3 is a perspective view, partly in cross section of a ceramic contact member for a semiconductor device made in accordance with the teachings of this invention.

With reference to FIG. 3, there is shown a ceramic member 40 embodying a further teaching of this invention. The member 40 has a plurality of slits 42 extending from the outer periphery of the member 40 to points within the interior of the member 40.

The member 40 comprises a body 41 of a good thermally conductive ceramic material such, for example, as beryllium oxide and aluminum oxide. A layer 44 of an electrically conductive metal covers all the exposed surfaces of the member 40 including the exposed surfaces within the slits 42. The layer 44 may be deposited on the member 40 by any suitable conventional metalizing process, such, for example, as plating, spraying, or fusing. An electrically conductive metal 46 such, for example, as copper, silver, gold, nickel, aluminum, iron and base alloys thereof is disposed within the slits 42. The member 40 is heated to the melting temperature (lower than the melting temperature of the metal in layer 44) of the conductive metal 46 so that the conductive metal 46 fills the slits 42 flush with the upper and lower surfaces and wets the layer 44. The member 40 is then cooled to room temperature thereby bonding the metal 46 to that portion of the layer 44 disposed on the wall surfaces of the slits 42.

It is intended that the foregoing description and drawings be interpreted as illustrative and not limiting.

I claim as my invention:

1. A semiconductor device comprising, in combination (1) a semiconductor wafer, (2) at least one thermally conductive ceramic contact member having a plurality of apertures therein, (3) a metalized coating disposed on all exposed surfaces of the ceramic member including the exposed surfaces of the apertures, (4) an electrically conductive metal disposed in and completely filling the apertures, and (5) a layer of electrically conductive material disposed between and forming the metalized ceramic member to the semiconductor wafer, the ceramic member and the semiconductor wafer having closely similar thermal coefficients of expansion over the temperature range to which the combination is subjected in manufacture and use.

2. A semiconductor device comprising, in combination, (1) a semiconductor wafer selected from the group consisting of silicon and germanium, (2) at least one thermally conductive ceramic contact member selected from the group consisting of beryllium oxide and aluminum oxide bonded to the wafer, the ceramic contact member having a plurality of apertures therein, (3) a metalized coating disposed on all exposed surfaces of the ceramic contact member including the exposed surfaces of the walls of the apertures, (4) an electrically conductive metal disposed in and completely filling the apertures, and (5) a layer of electrically conductive material disposed between and joining the ceramic member to the semiconductor wafer, the ceramic member and the semiconductor wafer having closely similar thermal coefficients of expansion over the temperature range to which the combination is subjected in manufacture and use.

3. A semiconductor device comprising, in combination, (1) a silicon semiconductor wafer, (2) at least one thermally conductive beryllium oxide contact member having a plurality of apertures, (3) a metalized coating disposed on all exposed surfaces of the ceramic contact member including the exposed surfaces of the apertures, (4) an electrically conductive metal selected from the group consisting of copper, silver, nickel, aluminum, iron and base alloys thereof disposed in and completely filling the apertures, and (5) a layer of electrically conductive bonding material disposed between and joining the metalized ceramic member to the silicon wafer.

4. A semiconductor device comprising, in combination, (1) a germanium semiconductor wafer, (2) at least one thermally conductive aluminum oxide contact member having a plurality of apertures, (3) a metalized coating disposed on all exposed surfaces of the ceramic contact member including the exposed surfaces of the apertures, (4) an electrically conductive metal selected from the group consisting of copper, siliver, nickel, aluminum, iron and base alloys thereof disposed in and completely filling the apertures, and (5) a layer of electrically conductive bonding material disposed between and joining the metalized ceramic member to the germanium wafer.

5. In a semiconductor rectifier assembly (1) a base member, (2) a subassembly positioned on the base, the subassembly comprising a semiconductor wafer and a contact secured to at least one face of the wafer, the contact comprising a thermally conductive ceramic member having a plurality of apertures, a metalized coating disposed on all exposed surfaces of the ceramic contact member including the exposed surfaces of the apertures, an electrically conductive metal disposed in and completely filling the apertures, an electrically conductive material securing the contact to the semiconductor wafer, the ceramic member and the semiconductor wafer having closely similar thermal expansion characteristics, (3) at least one electrical conductor disposed on and in an electrically conductive relationship with the semiconductor wafer, and (4) a header enclosing the subassembly and joined to the base to provide a hermetic seal for the semiconductor wafer.

6. A semiconductor rectifier assembly comprising (1) a good electrically and thermally conductive base member, (2) a subassembly joined to the base, the subassembly comprising a semiconductor wafer of a material selected from the group consisting of silicon and germanium and a contact having a plurality of apertures therein joined by an electrically conductive material to each face of the wafer, each of the contacts comprising a ceramic member selected from the group consisting of beryllium oxide and aluminum oxide and having a metalized coating disposed on all exposed surfaces including the surfaces of the apertures, the apertures being completely filled with an electrically conductive metal selected from the group consisting of copper, silver, nickel, iron, aluminum and base alloys thereof, (3) at least one electrical conductor disposed on and in a good electrically conductive relationship with one of the contacts, and (4) a header enclosing the subassembly and joined to the base to provide a hermetic seal for the semiconductor wafer.

7. A relatively flat, ceramic member suitable for use in a semiconductor device as a contact member for a semiconductor wafer, the member having a plurality of apertures contained therein the member comprising a materital selected from the group consisting of aluminum oxide and beryllium oxide, a metalized coating disposed on all exposed surfaces of the member including wall surfaces of the apertures, an electrically conductive metal selected from the group consisting of copper, silver, aluminum, nickel, iron and base alloys thereof disposed in, and completely filling, the apertures.

8. A relatively flat, ceramic member suitable for use in a semiconductor device as a contact member for a semiconductor wafer, the member having a plurality of apertures contained therein, a metalize coating disposed on all exposed surfaces of the ceramic member including the wall surfaces of the apertures, an electrically conductive metal disposed in, and completely filling the apertures, the member being capable of conducting electricity readily and dissipating heat rapidly.

9. A semiconductor device comprising, in combination, (1) a semiconductor wafer, (2) at least one thermally conductive ceramic contact member having a plurality of apertures therein, the the apertures being relatively uniformly spaced, (3) a metalized coating disposed on all exposed surfaces of the ceramic contact member including the surface of the walls of the apertures, (4) an electrically conductive metal disposed in and completely filling the apertures, and (5) a layer of electrically conductive material disposed between and joining the semiconductor wafer to the metalized ceramic contact member and the ceramic member and the semiconductor wafer having closely similar thermal coefficients of expansion over the temperature range to which the combination is subjected in manufacture and use.

10. A semiconductor device comprising, in combination, (1) a semiconductor wafer, (2) at least one thermally conductive ceramic contact member having an irregular outer surface comprising reentrant angles and slits bonded to the wafer, (3) a metalized coating disposed on all exposed surfaces of the ceramic contact member including the surface of the walls of the reentrant angles and slits, (4) an electrically conductive metal disposed in and completely filling the space contained between the walls of the reentrant angles and splits, and (5) a layer of electrically conductive material disposed between and joining the ceramic contact member to the semiconductor wafer, the ceramic member and the semiconductor wafer having closely similar thermal coefficients of expansion over the temperature range to which the combination is subjected in manufacture and use.

References Cited by the Examiner

UNITED STATES PATENTS

| | | | |
|---|---|---|---|
| 2,971,138 | 2/1961 | Meisel et al. | 317—234 |
| 2,751,528 | 6/1956 | Burton | 317—234 |
| 2,752,541 | 6/1956 | Losco | 317—234 |
| 2,763,822 | 9/1956 | Frola et al. | 317—234 |
| 2,863,105 | 12/1958 | Ross | 317—234 |
| 2,864,006 | 12/1958 | Vandeven | 307—88.5 |
| 3,021,461 | 2/1962 | Oakes et al. | 317—235 |

JOHN W. HUCKERT, *Primary Examiner.*

R. SANDLER, *Assistant Examiner.*